United States Patent
Stahel et al.

(10) Patent No.: US 9,782,805 B2
(45) Date of Patent: Oct. 10, 2017

(54) METHOD FOR REDUCING OR REMOVING ORGANIC AND INORGANIC CONTAMINATION FROM A VACUUM SYSTEM OF IMAGING AND ANALYTICAL DEVICES AND A DEVICE FOR CARRYING IT OUT

(71) Applicants: Masarykova univerzita, Brno (CZ); TESCAN ORSAY HOLDING, a.s., Brno (CZ)

(72) Inventors: Pavel Stahel, Javornik (CZ); Mirko Cernak, Bratislava (SK); Zdenek Navratil, Brno (CZ); Jaroslav Jiruse, Blansko (CZ); Jiri Fiala, Blansko (CZ); Martin Hanicinec, Uherske Hradiste (CZ)

(73) Assignees: MASARYKOVA UNIVERZITA (CZ); TESCAN ORSAY HOLDING, A.S. (CZ)

( * ) Notice: Subject to any disclaimer, the term of this patent is extended or adjusted under 35 U.S.C. 154(b) by 373 days.

(21) Appl. No.: 14/608,476

(22) Filed: Jan. 29, 2015

(65) Prior Publication Data
US 2015/0209841 A1 Jul. 30, 2015

(30) Foreign Application Priority Data
Jan. 30, 2014 (CS) ........................................ 2014-74

(51) Int. Cl.
*B08B 7/00* (2006.01)
*G03F 7/20* (2006.01)

(52) U.S. Cl.
CPC ........ *B08B 7/0035* (2013.01); *G03F 7/70841* (2013.01); *G03F 7/70925* (2013.01); *H01J 2237/26* (2013.01); *H01J 2237/28* (2013.01)

(58) Field of Classification Search
CPC ... B08B 7/0035; H01J 37/00; H01J 37/32522; H01J 37/32834; H01J 2237/335; G03F 7/70925; G03F 7/70841
USPC .......... 134/1, 1.1; 156/345.1, 345.24, 345.28
See application file for complete search history.

(56) References Cited

U.S. PATENT DOCUMENTS

| 5,462,674 A | 10/1995 | Butters et al. |
|---|---|---|
| 2003/0066975 A1 | 4/2003 | Okada |

*Primary Examiner* — Eric Golightly
(74) *Attorney, Agent, or Firm* — Ostrolenk Faber LLP

(57) ABSTRACT

A method for reducing or removing organic and/or inorganic contamination from a vacuum system of imaging and analytical devices, wherein at least a portion of the area of the inner surface of the vacuum space of the vacuum system is provided with a photocatalytic layer, at least a portion of this photocatalytic layer being cooled to a temperature in the range of 0 K to 280 K, whereby the photocatalytic layer is afterwards at least partially irradiated by electromagnetic radiation, which activates a photocatalytic reaction of the photocatalytic layer with the adsorbed gases of the atmosphere of the inner vacuum space of the vacuum system, where this reaction decomposes the contaminants, reducing their concentration and/or the concentration of water in the inner vacuum space of the vacuum system.

13 Claims, 1 Drawing Sheet

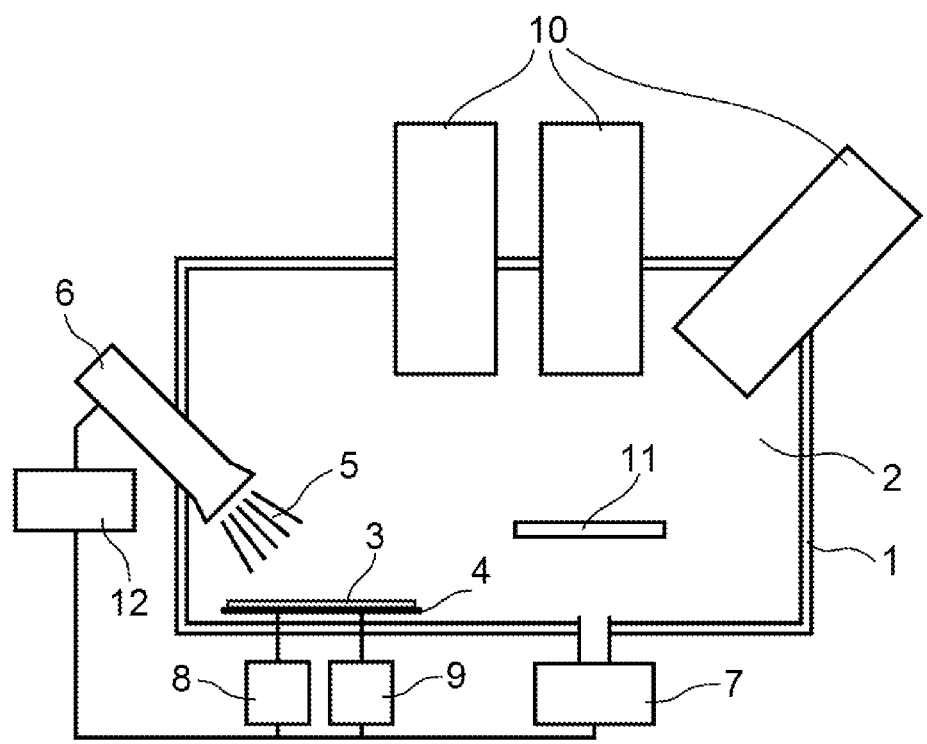

METHOD FOR REDUCING OR REMOVING ORGANIC AND INORGANIC CONTAMINATION FROM A VACUUM SYSTEM OF IMAGING AND ANALYTICAL DEVICES AND A DEVICE FOR CARRYING IT OUT

CROSS-REFERENCE TO RELATED APPLICATIONS

This application claims benefit of Czech Republic Application no. PV 2014-74, filed Jan. 30, 2014, the contents of which are incorporated herein by reference.

TECHNICAL FIELD OF THE INVENTION

The invention relates to a method for reducing or removing organic and inorganic contamination from a vacuum system of imaging and analytical devices.

The invention also relates to a device for reducing or removing organic and inorganic contamination from a vacuum system of imaging and analytical devices.

BACKGROUND OF THE INVENTION

Contamination of vacuum systems, their inner surfaces as well as the associated contamination of residual atmosphere inside the vacuum systems represents a major problem in analytical techniques and techniques employing beams of charged ions, electromagnetic radiation, etc. Also, contamination of vacuum systems by organic compounds causes complications during the process of layers or structures formation in the vacuum.

Numerous techniques are currently used in decontamination of vacuum systems for removing organic compounds. During the installation of vacuum systems, it is primarily mechanical and chemical methods for cleaning vacuum units and systems that are used. Known are also plasma cleaning methods of vacuum systems used during the production process. In vacuum systems which are in use, where contamination increases depending on the duration of operation not only on the walls of the system, but residual atmosphere contamination (of the gases) associated with it also increases, using the above-mentioned methods requires either complete or partial dismantling of the vacuum system.

Nowadays, in vacuum systems that are already in operation, decontamination of the surface is carried out at higher temperatures of the vacuum system. This, however, bears the risk of damaging some parts of the vacuum system by the higher temperatures. Moreover, this method is energetically demanding and time-consuming and although it creates more stable layer on the surface of the system, but considerable amount of the contaminants remains in the system in the form of residual compounds.

Another method used for reducing contamination of vacuum systems is a plasma decontamination device, which makes use of the fact that the oxygen radicals or hydroxyl radicals generated in the chamber of the decontamination device react with the contaminants inside the vacuum system, which results in the decomposition of the contaminants and their subsequent pumping out of the vacuum system into the pumping system. Nevertheless, this method of decontamination is time-consuming and the price of the plasma decontamination device is high. Another drawback of this method of decontamination is the interaction of the reactive particles with parts of the vacuum system, whereby this interaction is undesirable and may cause improper functioning of parts of the vacuum system or their corrosion.

Direct plasma decontamination in vacuum systems that are already in operation, in which the plasma reactor includes a vacuum chamber, has limited applicability due to the risk of the material, such as metals, being sprayed over the entire inner area of the vacuum system, which is associated with subsequent technological problems during using the vacuum systems, for example problems with formation of conducting layers on isolators or waveguides, etc.

Another well-known method for reducing the concentration of contaminants which are found in a vacuum system is the so-called Cryo can/Coldfinger/Cold trap decontamination device, which uses the undercooling of the surface area of the vacuum system to the temperature of liquid nitrogen followed by adsorption of hydro-carbon compounds onto this undercooled area, by which means the contaminants are efficiently removed from the residual atmosphere inside the vacuum chamber. The disadvantage of this method is especially the fact that the contaminants remain inside the system in which after finishing the cooling process they are released again from the undercooled areas back to the atmosphere of the vacuum system.

Photocatalytic materials are used in many fields of modern technology and nowadays these materials can be found in a number of common applications, such as decontamination of water, air, etc. The most frequently used material is nano-crystalline titanium dioxide $TiO_2$, which is activated by UVA radiation. Other materials, such as ZnO or metal-doped $TiO_2$, exhibiting photoactivity even under visible light irradiation, are also common in numerous applications. Most applications of photocatalytic processes take place under atmospheric pressure. Decontamination of the system using a photocatalyst is described, for example, in U.S. Pat. No. 5,462,674 (B. E. Butters, A. L. Powel), which deals with a method and system for photocatalytic cleaning of contaminated liquid, as well as in US patent application No 2003/0066975 (Masashi Okada), disclosing a system and method for reducing contamination in a microlithography system based on photocatalysis. The disadvantage of the method for the decontamination of gases or vacuum systems according to these patent documents, i.e. using only a photocatalytic layer, is a relatively low speed of decontamination, since the decontamination process takes place only in the particles adsorbed onto the surface of the photocatalytic layer and, especially in the vacuum, the spontaneous adsorption of the particles onto the surface at room temperature is rather slow.

The above-mentioned drawbacks have been overcome by the present invention, in which a surface covered with a photocatalytic layer, undercooled to an extremely low temperature, is used for decontamination. The adsorption of the particles of the inner atmosphere of the vacuum system onto the part of the inner surface of the vacuum system, whose temperature is lower than that of the environment, is considerably faster. As a lot more particles adheres to the surface of the photocatalytic layer during a short time due to undercooling, more particles are subsequently decomposed by the photocatalytic process. Another substantial benefit of the present invention is the fact that the efficiency of the photocatalytic process itself increases with a decreasing temperature. The goal of the invention is to eliminate or at least reduce the disadvantages of the background art, particularly enhance the efficiency of the decontamination of vacuum systems, improving at the same time the operating conditions of decontamination and making the decontamination process more affordable, not only from the point of view of purchase costs, but also operating and maintenance costs. Last but not least, the aim is to reduce the demands placed on the operator of the decontamination system.

SUMMARY OF THE INVENTION

The aim of the invention is achieved by a method for removal of organic and inorganic contamination from a vacuum system of imaging and analytical devices, whose principle consists in that at least a portion of the inner surface area of the vacuum space of the vacuum system is provided with a photocatalytic layer, whereby at least the portion of this photocatalytic layer is cooled to a temperature in the range of 0 K to 280 K. Afterwards, the photocatalytic layer is at least partially irradiated by electromagnetic radiation, which activates a photocatalytic reaction of the photocatalytic layer with the adsorbed gases of the inner vacuum space of the vacuum system. This photocatalytic reaction decomposes the contaminants and decreases their concentration and/or the concentration of water in the inner vacuum space of the vacuum system.

The irradiation of the above-mentioned photocatalytic layer by electromagnetic radiation can be carried out either continuously, or at regularly or irregularly repeated intervals, with intermittent pauses of identical or different length.

The cooling of at least the portion of the inner surface provided with the photocatalytic layer may be also conducted repeatedly at regular or irregular intervals, with intermittent pauses of identical or different length.

At least the portion of the inner surface area of the vacuum space of the vacuum system, which is provided with the photocatalytic layer, may be also heated at regular or irregular intervals to a temperature in the range of 300 K to 680 K, with alternating intervals of cooling and heating.

In a preferred embodiment, the duration of the individual intervals and intermittent pauses during the process of irradiation and/or cooling and/or heating is in the range of 0.1 s to 180 min.

The photocatalytic layer is irradiated either by electromagnetic radiation at constant intensity, or by alternating higher or lower intensity electromagnetic radiation, whereby the intensity of the used radiation at lower intensity equals a maximum of 50% of the used radiation at higher intensity.

The above-mentioned photocatalytic layer is irradiated either by electromagnetic radiation having a constant wavelength, or alternately by electromagnetic radiation having a higher or lower wavelength, whereby the energy of the electromagnetic radiation with a higher wavelength is higher or lower than the forbidden band width of the material of the photocatalytic layer.

The irradiation of the photocatalytic layer is carried out either under the working pressure of the vacuum system, or under pressures that are higher than the working pressure in the inner space of the vacuum system.

In a preferred embodiment, the wavelength of the electromagnetic radiation used for the irradiation of the photocatalytic layer is in the range of 0.2 nm to 1000 nm.

For the photocatalytic layer it is possible to use one photocatalytic material or at least two different photocatalytic materials.

In another advantageous embodiment, fluorescent photocatalytic material is used as a material of at least a portion of the photocatalytic layer.

At least the portion of the inner surface area of the vacuum space of the vacuum system, which is provided with the photocatalytic layer, may be situated in close vicinity of the sample.

The principle of a device for reducing or removing organic and inorganic contamination of a vacuum system of imaging and analytical devices consists in that at least a portion of the inner surface area of the vacuum space of the vacuum system is provided with a photocatalytic layer and is in thermal contact with a cooling device. The device further comprises a source of electromagnetic radiation for the irradiation of the photocatalytic layer by electromagnetic radiation.

The source of electromagnetic radiation for the irradiation of the photocatalytic layer may be further connected to a control mechanism of the output and/or time and/or wavelength of the source of the electromagnetic radiation. The control mechanism is also connected to the above-mentioned cooling system and/or heating system, being also in thermal contact with at least the portion of the inner surface area of the vacuum space of the vacuum system provided with a photocatalytic layer. The control mechanism is equipped with means of controlling the temperature of at least the portion of the inner surface area of the vacuum space of the vacuum system provided with the photocatalytic layer and the period of time of keeping the temperature.

The above-mentioned control mechanism of the output and/or time and/or wavelength of the source of the electromagnetic radiation may be equipped with means of controlling the pumping system of the vacuum system.

The source of the electromagnetic radiation may be placed inside the vacuum space of the vacuum system or outside the vacuum space of the vacuum system.

At least the portion of the inner surface area of the vacuum space of the vacuum system, which is at least on the portion of its area provided with the photocatalytic layer, may be designed as a separate unit which is equipped with means of temporary or permanent attachment to the vacuum system.

At least the portion of the inner surface area of the vacuum space of the vacuum system, which is at least on the portion of its area provided with the photocatalytic layer, can move inside the vacuum space of the vacuum system.

For the above-mentioned photocatalytic layer it is possible to use either one photocatalytic material or at least two different photocatalytic materials. As a material of at least the portion of the photocatalytic layer it is possible to use a fluorescent photocatalytic material.

The advantage of this invention is the fact that it improves and facilitates the process of decontamination of the vacuum space of the vacuum system using relatively simple technical means and at the same time it also enables to reduce the contamination of the vacuum space by water or steam. Another benefit of the invention is the fact that it can be used both in vacuum systems which are presently produced and in already existing vacuum systems without having to make any major alterations, e.g. to the pumping system, etc.

BRIEF DESCRIPTION OF THE DRAWINGS

FIG. 1 is a schematic diagram representing the invention. The diagram comprises a vacuum chamber, a photocatalytic layer applied to the portions of the inner surface of the vacuum space of the vacuum system, electromagnetic radiation coming out from a source of electromagnetic radiation and falling on the photocatalytic layer. The diagram further includes a pumping system of the vacuum system, a cooling and heating systems, imaging and analytical techniques, a sample under examination and a control mechanism.

DESCRIPTION OF EMBODIMENTS

The invention relates to a method for reducing or removing organic and inorganic contaminants of a vacuum system of imaging and analytical devices and techniques, such as scanning electron microscopes (SEM), transmission electron microscopes (TEM), scanning electron microscopes combined with focused ion beam (SEM-FIB), X-Ray photoelectron spectroscopy (XPS), matrix-assisted laser desorption/ionisation (MALDI), secondary ion mass spectroscopy (SIMS) and other analytical and inspection techniques which utilize an electron, ion, laser or X-ray beam to analyze or display the surface or volume of a sample.

The vacuum system shown in FIG. 1 comprises a vacuum chamber 1 of the vacuum system and one or more imaging and/or analytical devices 10 examining a sample 11. The system also comprises a photocatalytic layer 3, which may be applied to at least a portion 4 of the inner surface area of the vacuum space 2 of the vacuum system, or to at least a portion 4 of the inner surface area of the vacuum space 2 of the vacuum system which is temporarily attached to the vacuum space 2 of the vacuum system as a separate unit. The system further comprises a source 6 of electromagnetic radiation 5 having an appropriate wavelength which falls on the surface provided with the photocatalytic layer 3. The vacuum space is pumped by a pumping system 7, which represents both pumping systems transporting molecules out of the pumped space and also pumping systems not transporting molecules out of the pumped space (e.g. getter materials) and at least the portion 4 of the inner surface area of the vacuum space 2 of the vacuum system provided with the photocatalytic layer 3 is cooled by a cooling system 8 and may be also heated by a heating system 9.

The decontamination process of the vacuum system using a photocatalytic process is in principle carried out as follows. The photocatalytic layer 3, applied to at least the portion 4 of the inner surface area of the vacuum space 2 of the vacuum system according to FIG. 1, is irradiated (excited) by electromagnetic radiation 5 having an appropriate wavelength, especially in the range of wavelength between 0.2 nm-1000 nm, by which means high surface energy is obtained on the surface of the irradiated photocatalytic layer 3. As a result, during the contact of a particle of the contaminant with the surface of the aforementioned irradiated photocatalytic layer 3 the particle is captured on the surface of the irradiated photocatalytic layer 3. Due to the subsequent photocatalytic reaction, which is induced by electromagnetic radiation 5, the particle of the contaminant is decomposed, whereupon the resulting products are released back to the vacuum space 2 of the vacuum system, out of which these products resulting from the process of decomposition of the particles of the contaminant are pumped by means of the classical pumping system 7, since pumping the products resulting from the decomposition of the particles of the contaminant is substantially easier than the direct pumping of the particles of the contaminant. To make the decontamination process more effective, the portion 4 of the inner surface area of the vacuum space 2 of the vacuum system, covered with the photocatalytic layer 3, is cooled to low temperatures in the range of 0 K to 280 K by means of the cooling system 8. Beside cooling, it is also possible to heat the portion 4 of the inner surface area of the vacuum space 2 of the vacuum system, covered with the photocatalytic layer 3, by means of a heating system 9 to temperatures between 300 K and 680 K.

The process of the decomposition of the particles of the contaminant as such takes place owing to the fact that a photocatalytic reaction occurs upon the exposure of the surface with the photocatalytic layer 3 to electromagnetic radiation 5 having an appropriate wavelength. The organic and inorganic substances present are decomposed by the free electron-hole pair which has arisen primarily in the material of the photocatalytic layer 3 and by highly reactive hydroxyl radicals, which arise secondarily as a result of the contact of the excited molecule of the material of the photocatalytic layer 3 with water vapours or water adsorbed on the inner surface of the vacuum space 2 of the vacuum system. The resulting products in a gaseous phase are afterwards pumped by means of the pumping system 7 out of the vacuum space 2 of the vacuum chamber 1 or they are bound in getter materials, which are part of the pumping system 7. Thus, the concentration of the undesirable contaminants in the vacuum system decreases. Also, the photocatalytic reaction utilizes the water which is adsorbed on the inner surface of the vacuum system. Therefore the invention can be also used for decreasing the concentration of water in vacuum systems utilizing high vacuum (HV), ultrahigh vacuum (UHV) and extremely high vacuum (XHV). The photocatalytic layer 3 on the inner surface of the vacuum system or on its portion may be created by means of different techniques, such as vacuum evaporation, sputtering, plasma deposition or also simply by soaking or spin coating of liquid precursors, etc. The structures of the material of the photocatalytic layer 3 applied to at least portions of the inner surface area of the vacuum space 2 of the vacuum system, is composed of either a continuous layer, or consists of individual zones of the material of the photocatalytic layer 3 ranging in size from 100 nm from 30 cm. In principle, any material which exhibits photocatalytic properties can be used as a material of the photocatalytic layer 3, including doped photocatalysts. To enhance the photocatalytic reaction, it is possible to add water vapours or other gases to the vacuum system, which accelerate the photocatalytic reaction of the vacuum system. Examples of the materials that can be used for the photocatalytic layer include nanocrystalline titanium dioxide $TiO_2$ or zinc oxide $ZnO$, which are activated by near-UVA radiation, as well as, for example, metal-doped titanium dioxide $TiO_2$, which exhibits photocatalytic activity even when being exposed to electromagnetic radiation in the visible part of the spectrum.

In an example of embodiment, the photocatalytic layer 3 is made of a fluorescent photocatalytic material, i.e. material exhibiting the phenomenon of fluorescence after being irradiated by electromagnetic radiation 5, which means that it emits light. Using a fluorescent photocatalytic material as the material of the photocatalytic layer 3 enables, for example, to evaluate the level of the contamination of the inner surface of the vacuum space 2 of the vacuum system according to the current level of fluorescence of the fluorescent photocatalytic material.

In yet another example of embodiment, at least two different photocatalytic materials are used for the photocatalytic layer 3 in the vacuum space 2 of the vacuum system, which results in extending the spectrum of part of the contaminants which can be removed from the vacuum space 2 of the vacuum system with the aid of the present invention.

According to another example of embodiment, the cooling of the portion 4 of the inner surface area of the vacuum space 2 of the vacuum system, covered with the photocatalytic layer 3, is carried out at repeated regular or irregular intervals, which are interrupted by identical or different periods of time, whereby the duration of these intervals and the gaps between them is in the range of 0.1 s to 180 min. The intermittent pause in the process of cooling the portion 4 of the inner surface area of the vacuum space 2 covered with the photocatalytic layer 3 is important from the point of view of the products resulting from the decomposition of the particles of the contaminant being released back to the vacuum space 2 of the vacuum system. After reaching the optimal velocity of the whole decontamination process, i.e. decomposition of the particles of the contaminant and the subsequent releasing of the products of this process of the degradation of the particles of the contaminant back to the vacuum space of the vacuum system to be pumped out by the pumping system, it is necessary to let the process of decontamination continue over a period of time corresponding to the particular contaminants which are being removed, combined with the used material of the photocatalytic layer 3. The irradiation of the photocatalytic layer 3 by electromagnetic radiation 5 can take place continuously or in synchronization with the above-mentioned cooling process, namely in such a manner that the irradiation of the photocatalytic layer 3 by electromagnetic radiation 5 is active within the interval of the cooling of the photocatalytic layer 3. According to another advantageous embodiment, both the cooling and irradiation of the photocatalytic layer 3 is conducted continuously.

According to another example of embodiment, the cooling of the portion 4 of the inner surface area of the vacuum space 2 of the vacuum system covered with the photocatalytic layer 3 is performed repeatedly at regular or irregular intervals, which are interrupted by intermittent pauses of identical or different length, whereby during the intermittent pause between the intervals in the process of cooling the portion 4 of the inner surface area of the vacuum space 2 is heated to the temperature in the range of 300 K to 680 K. This heating process then facilitates the desorption of the products resulting from the decomposition of the contaminants back to the vacuum space 2 of the vacuum system and their subsequent pumping by the pumping system 7. The irradiation of the photocatalytic layer 3 by electromagnetic radiation 5 can be performed continuously, or in synchronization with the above-mentioned cooling and heating, namely in such a manner that the irradiation of the photocatalytic layer 3 by electromagnetic radiation 5 is active within the interval of cooling the photocatalytic layer 3.

According to another preferred embodiment, the photocatalytic layer 3 is irradiated by electromagnetic radiation 5 alternating higher or lower intensity, whereby the intensity of the used radiation at lower intensity equals a maximum of 50% of the higher intensity radiation used. According to yet another advantageous embodiment, the photocatalytic layer 3 is irradiated alternately by electromagnetic radiation 5 having higher and lower wavelengths, whereby the energy of the electromagnetic radiation with higher wavelengths is higher or lower than the width of the forbidden band of the used material of the photocatalytic layer 3. The forbidden band of the photocatalytic layer 3 refers to the energy gap between the valence and conduction bands of the material of the photocatalytic layer 3, that is the energy required to create a free electron-hole pair in the material of the photocatalytic layer 3 and to initiate the photocatalytic reaction.

According to another advantageous embodiment, the irradiation of the photocatalytic layer 3 and pumping out the products of the decomposition of the particles of the contaminant is carried out under higher pressures than is the working pressure in the vacuum space 2 of the vacuum system.

In another example of embodiment, at least the portion 4 of the inner surface of the vacuum space 2 of the vacuum system covered with the photocatalytic layer 3 is placed in close vicinity of the sample examined by imaging and/or analytical devices 10. This embodiment of the invention is advantageous, since the contaminants will be more readily distributed closer to the portion 4 of the inner surface area of the vacuum space 2 of the vacuum system covered with the photocatalytic layer 3.

The invention is realized by means of a device for removing organic and inorganic contaminants from a vacuum system of imaging and analytical devices according to FIG. 1, which comprises a vacuum system with an inner surface of the vacuum space 2. The vacuum space 2 is connected to a pumping system 7. At least a portion 4 of the inner surface area of the vacuum space 2 of the vacuum system is provided with a photocatalytic layer 3. The system further comprises a source 6 of electromagnetic radiation 5, which is connected to a control mechanism 12 of output and/or time and/or the wavelength of the source 6 of electromagnetic radiation 5. In addition, the control mechanism 12 may be provided with means of controlling the pumping system 7. The source 6 of electromagnetic radiation 5 is located either inside the vacuum space 2 of the vacuum system, or it is located outside the vacuum space 2 of the vacuum system. At least the portion 4 of the inner surface area of the vacuum space 2 of the vacuum system provided with the photocatalytic layer 3 is in thermal contact with the cooling device 8 and/or the heating device 9. The above-mentioned control mechanism 12 is also connected to the cooling device 8 and the heating device 9 and is equipped with means of controlling the temperature of at least the portion 4 of the inner surface area of the vacuum space 2 of the vacuum system and the period of time of keeping the temperature. For that purpose, according to one example of embodiment, the vacuum system is provided with means of measuring the temperature of the inner surface of the vacuum space 2 of the vacuum system.

So as to be able to find application of the device according to the present invention readily and without major alterations in already existing vacuum systems, according to another example of embodiment, at least the portion 4 of the inner surface area of the vacuum space 2 of the vacuum system covered with the photocatalytic layer is designed as a separate unit, which is provided with means of temporary or permanent attachment to the vacuum system, with which after being attached constitutes an integral assembly according to the invention, including fulfilling the functions of the control mechanism 12, cooling device 8, heating device 9, etc.

According to another example of embodiment, at least the portion 4 of the inner surface area of the vacuum space 2 of the vacuum system, which is on at least the portion of its area provided with the photocatalytic layer 3, can move inside the vacuum space 2 of the vacuum system.

INDUSTRIAL APPLICABILITY

The invention can be applied for removing organic and inorganic contaminants from a vacuum system of imaging and analytical devices, such as SEM, TEM, SEM-FIB, XPS, MALDI, SIMS and other analytical and inspection techniques, particularly the techniques that work under pressures in the range of 2E3 Pa to 10E-15 Pa and that employ an electron, ion, laser or X-ray beam for analyzing or imaging the surface or volume of the sample.

What is claimed is:

1. A method for reducing or removing organic and/or inorganic contamination from a vacuum system of imaging and analytical devices, wherein at least a portion of an area of an inner surface of a vacuum space of the vacuum system is provided with a photocatalytic layer, at least a portion of this photocatalytic layer being cooled to a temperature in the range of 0 K to 280 K, whereby the photocatalytic layer is afterwards at least partially irradiated by electromagnetic radiation, which activates a photocatalytic reaction of the photocatalytic layer with the adsorbed gases of an atmosphere of the inner vacuum space of the vacuum system, where this reaction decomposes contaminants, reducing their concentration and/or the concentration of water in the inner vacuum space of the vacuum system.

2. The method according to claim 1, wherein the irradiation of the photocatalytic layer is conducted continuously.

3. The method according to claim 1, wherein the irradiation of at least the portion of the photocatalytic layer is repeatedly conducted at regular or irregular intervals with intermittent pauses of identical or different length.

4. The method according to claim 2, wherein the cooling of at least the portion of the inner surface area of the vacuum space of the vacuum system provided with the photocatalytic layer is repeatedly conducted at regular or irregular intervals, which are interrupted by intermittent pauses of identical or different length.

5. The method according to claim 4, wherein at least the portion of the inner surface area of the vacuum space of the vacuum system provided with the photocatalytic layer is heated at regular or irregular intervals to a temperature in the range of 300 K to 680 K, with alternating intervals of cooling and heating.

6. The method according to claim 3, wherein the period of the individual intervals and intermittent pauses during the processes of cooling and/or cooling and/or heating is in the range of 0.1 to 180 min.

7. The method according to claim 1, wherein the photocatalytic layer is irradiated either by electromagnetic radiation at constant intensity, or alternating higher or lower intensity electromagnetic radiation, whereby the intensity of the used radiation at lower intensity equals a maximum of 50% of the used radiation at higher intensity.

8. The method according to claim 1, wherein the photocatalytic layer is irradiated either by electromagnetic radiation having a constant wavelength or alternately by electromagnetic radiation having a higher or lower wavelength, whereby the energy of the electromagnetic radiation with a higher wavelength is higher or lower than the forbidden band width of a material of the photocatalytic layer.

9. The method according to claim 1, wherein the irradiation of the photocatalytic layer is carried out either under the working pressure of the vacuum system, or under pressures that are higher than the working pressure in the inner space of the vacuum system.

10. The method according to claim 1, wherein the photocatalytic layer is exposed to electromagnetic radiation having a wavelength in the range of 0.2 nm to 1000 nm.

11. The method according to claim 1, wherein for the photocatalytic layer either one photocatalytic material is used, or at least two different photocatalytic materials are used.

12. The method according to claim 1, wherein a fluorescent photocatalytic material is used as a material of at least the portion of the photocatalytic layer.

13. The method according to claim 1, wherein at least the portion of the inner surface area of the vacuum space of the vacuum system provided with a photocatalytic layer is placed in close vicinity of the sample.

* * * * *